United States Patent
Camacho et al.

(10) Patent No.: US 8,283,209 B2
(45) Date of Patent: Oct. 9, 2012

(54) SEMICONDUCTOR DEVICE AND METHOD OF FORMING PiP WITH INNER KNOWN GOOD DIE INTERCONNECTED WITH CONDUCTIVE BUMPS

(75) Inventors: Zigmund R. Camacho, Singapore (SG); Frederick R. Dahilig, Singapore (SG); Lionel Chien Hui Tay, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 376 days.

(21) Appl. No.: 12/635,631

(22) Filed: Dec. 10, 2009

(65) Prior Publication Data

US 2011/0140263 A1 Jun. 16, 2011

(51) Int. Cl.
*H01L 21/00* (2006.01)
(52) U.S. Cl. ............. 438/109; 257/786; 257/E23.069
(58) Field of Classification Search ............. 257/777, 257/779–781, 778, 786, E23.069; 438/613, 438/108, 109
See application file for complete search history.

(56) References Cited

U.S. PATENT DOCUMENTS

| | | | |
|---|---|---|---|
| 6,191,494 B1 * | 2/2001 | Ooyama et al. | 257/796 |
| 6,815,254 B2 | 11/2004 | Mistry et al. | |
| 7,919,850 B2 * | 4/2011 | Trasporto et al. | 257/698 |
| 2007/0178667 A1 | 8/2007 | Lee et al. | |
| 2007/0187826 A1 | 8/2007 | Shim et al. | |

* cited by examiner

*Primary Examiner* — Jenny L Wagner
(74) *Attorney, Agent, or Firm* — Robert D. Atkins; Patent Law Group: Atkins & Associates, P.C.

(57) ABSTRACT

A PiP semiconductor device has an inner known good semiconductor package. In the semiconductor package, a first via is formed in a temporary carrier. A first conductive layer is formed over the carrier and into the first via. The first conductive layer in the first via forms a conductive bump. A first semiconductor die is mounted to the first conductive layer. A first encapsulant is deposited over the first die and carrier. The semiconductor package is mounted to a substrate. A second semiconductor die is mounted to the first conductive layer opposite the first die. A second encapsulant is deposited over the second die and semiconductor package. A second via is formed in the second encapsulant to expose the conductive bump. A second conductive layer is formed over the second encapsulant and into the second via. The second conductive layer is electrically connected to the second die.

25 Claims, 13 Drawing Sheets

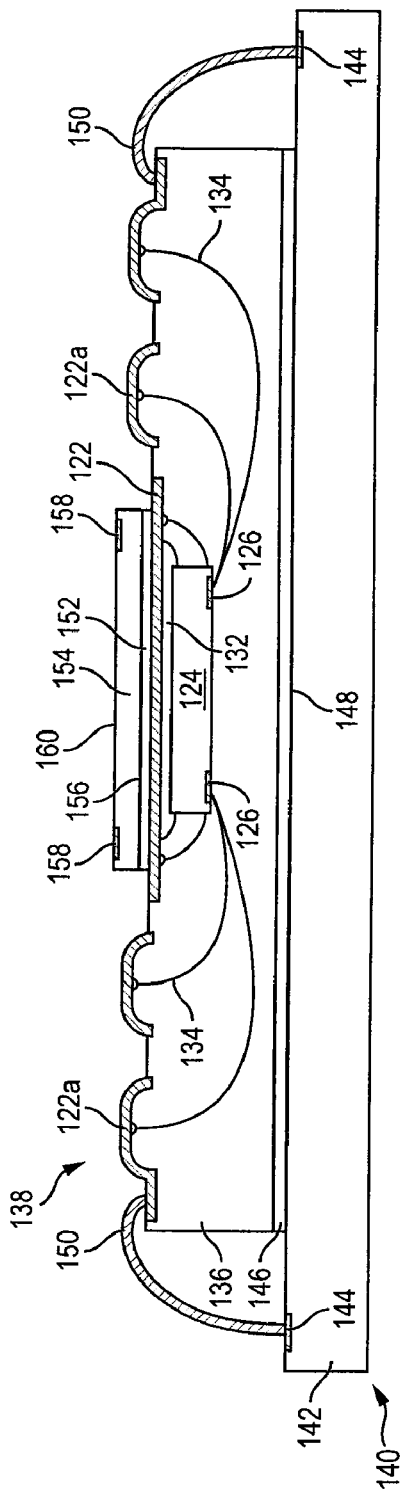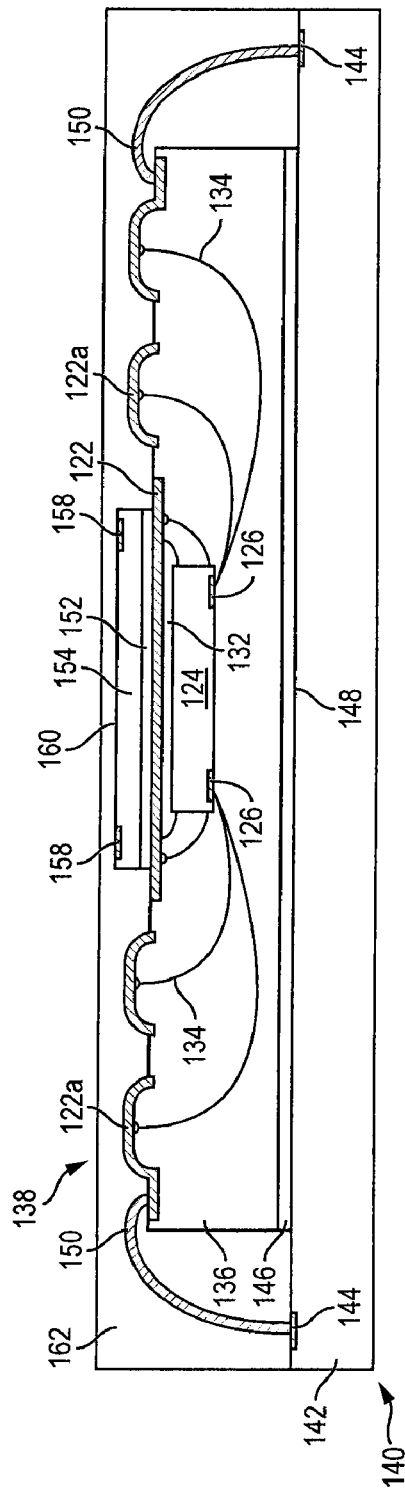

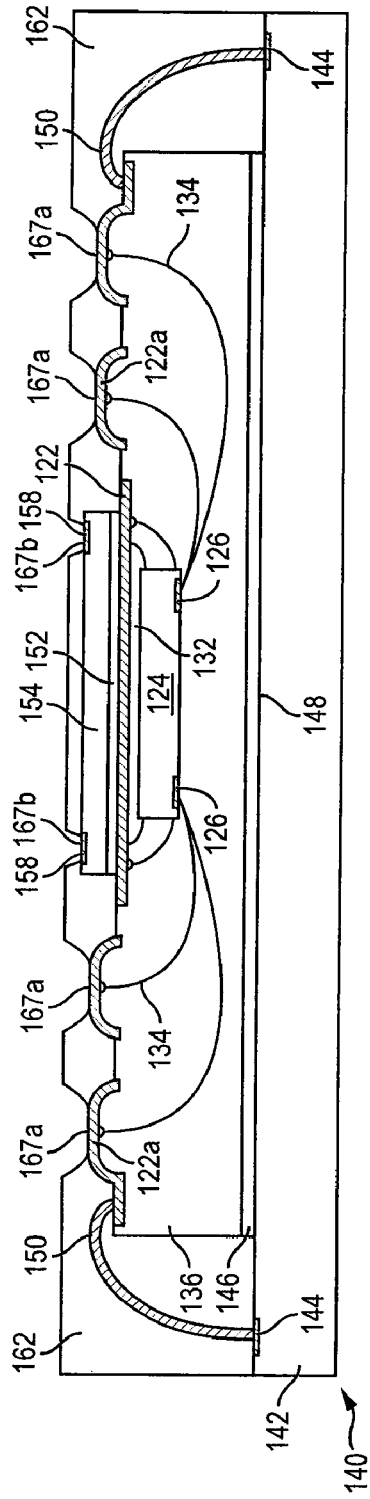
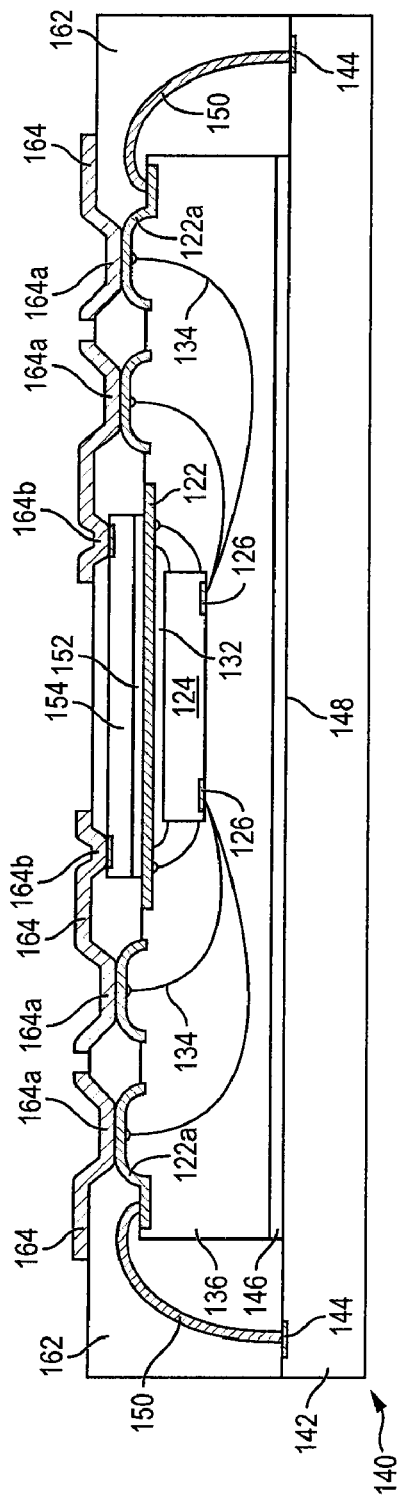

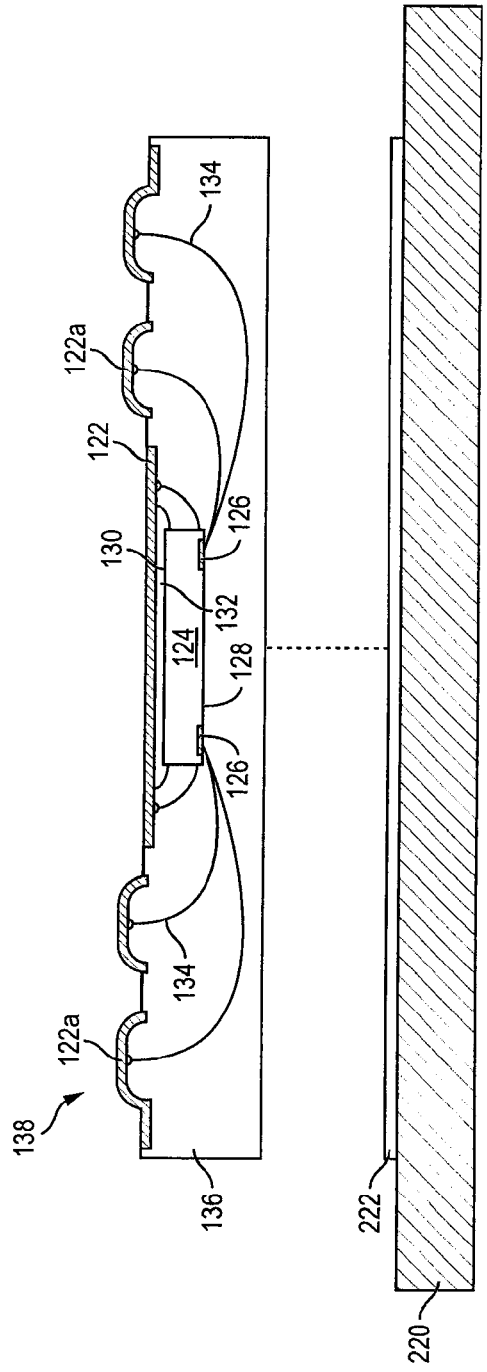
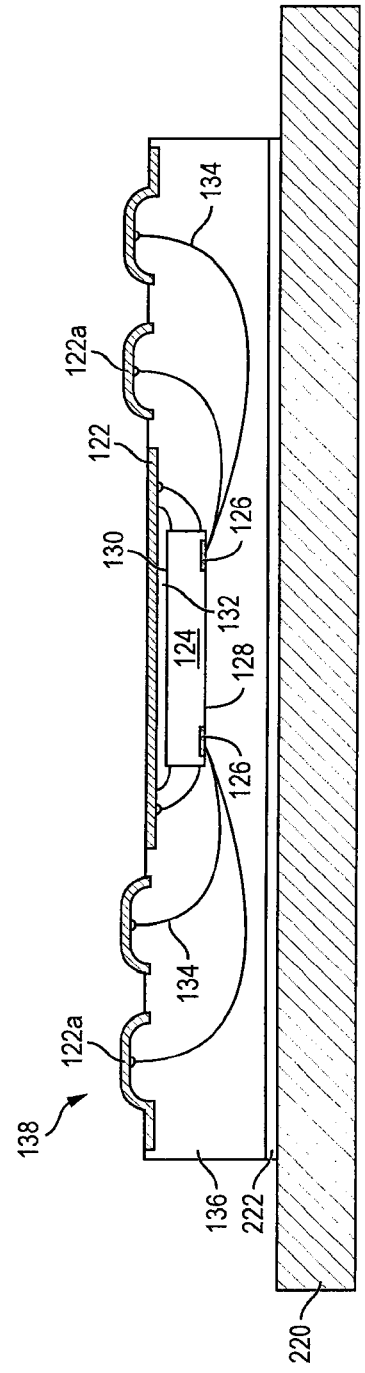
FIG. 8a
FIG. 8b

SEMICONDUCTOR DEVICE AND METHOD OF FORMING PIP WITH INNER KNOWN GOOD DIE INTERCONNECTED WITH CONDUCTIVE BUMPS

FIELD OF THE INVENTION

The present invention relates in general to semiconductor devices and, more particularly, to a semiconductor device and method of forming a package-in-package configuration with an inner known good die interconnected with conductive bumps formed in shallow vias.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

Some semiconductor devices are configured as a package-in-package (PiP). The semiconductor die are interconnected by bond wires or deep conductive through silicon vias (TSV) or deep conductive through hole vias (THV). The interconnect structure increases the PiP thickness and manufacturing costs.

SUMMARY OF THE INVENTION

A need exists to electrically interconnect PiP without deep TSV or THV. Accordingly, in one embodiment, the present invention is a method of making a semiconductor device comprising the steps of providing a temporary carrier, forming a first via in the temporary carrier, and forming a first conductive layer over the temporary carrier and into the first via. The first conductive layer in the first via forms a conductive bump. The method further includes the steps of mounting a first semiconductor die to the first conductive layer, forming a bond wire between the first semiconductor die and first conductive layer, depositing a first encapsulant over the first semiconductor die, first conductive layer, temporary carrier, and bond wire, removing the temporary carrier to provide a semiconductor package with the conductive bump exposed, providing a substrate, mounting a surface of the semiconductor package opposite the conductive bump to the substrate, mounting a second semiconductor die to the first conductive layer opposite the first semiconductor die, depositing a second encapsulant over the second semiconductor die and semiconductor package, forming a second via in the second encapsulant to expose the conductive bump, and forming a second conductive layer over the second encapsulant and into the second via. The second conductive layer is electrically connected to the second semiconductor die.

In another embodiment, the present invention is a method of making a semiconductor device comprising the steps of providing a carrier, forming a first via in the carrier, and forming a first conductive layer over the carrier and into the first via. The first conductive layer in the first via forms a conductive bump. The method further includes the steps of mounting a first semiconductor die or component to the first conductive layer, depositing a first encapsulant over the first semiconductor die or component, first conductive layer, and carrier, removing the carrier to provide a semiconductor package with the conductive bump exposed, providing a support layer, mounting the semiconductor package to the support layer, mounting a second semiconductor die or component to the first conductive layer opposite the first semiconductor die or component, depositing a second encapsulant over the second semiconductor die or component and semiconductor package, and forming an interconnect structure over the second encapsulant. The interconnect structure is electrically connected to the conductive bump and second semiconductor die or component.

In another embodiment, the present invention is a method of making a semiconductor device comprising the steps of forming a semiconductor package having a first surface with a conductive bump and second surface opposite the first surface, providing a support layer, mounting the second surface of the semiconductor package to the substrate, mounting a first semiconductor die or component to the first surface of the semiconductor package, depositing a first encapsulant over the first semiconductor die or component and semiconductor package, and forming an interconnect structure over the first encapsulant. The interconnect structure is electrically connected to the conductive bump and first semiconductor die or component.

In another embodiment, the present invention is a semiconductor device comprising a support layer and semiconductor package having a first surface with a conductive bump and second surface opposite the first surface. The second surface of the semiconductor package is mounted to the support layer. A first semiconductor die or component is mounted to the first surface of the semiconductor package. A first encapsulant is deposited over the first semiconductor die or component and semiconductor package. An interconnect structure is formed over the first encapsulant. The interconnect structure is electrically connected to the conductive bump and first semiconductor die or component.

BRIEF DESCRIPTION OF THE DRAWINGS

FIGS. 3a-3j illustrate a process of forming wafer level PiP mounted to a substrate with inner known good die interconnected with conductive bumps formed in shallow vias;

FIGS. 8a-8h illustrate a process of forming PiP mounted to a carrier with inner known good die interconnected with conductive bumps formed in shallow vias.

DETAILED DESCRIPTION OF THE DRAWINGS

Figure 1:
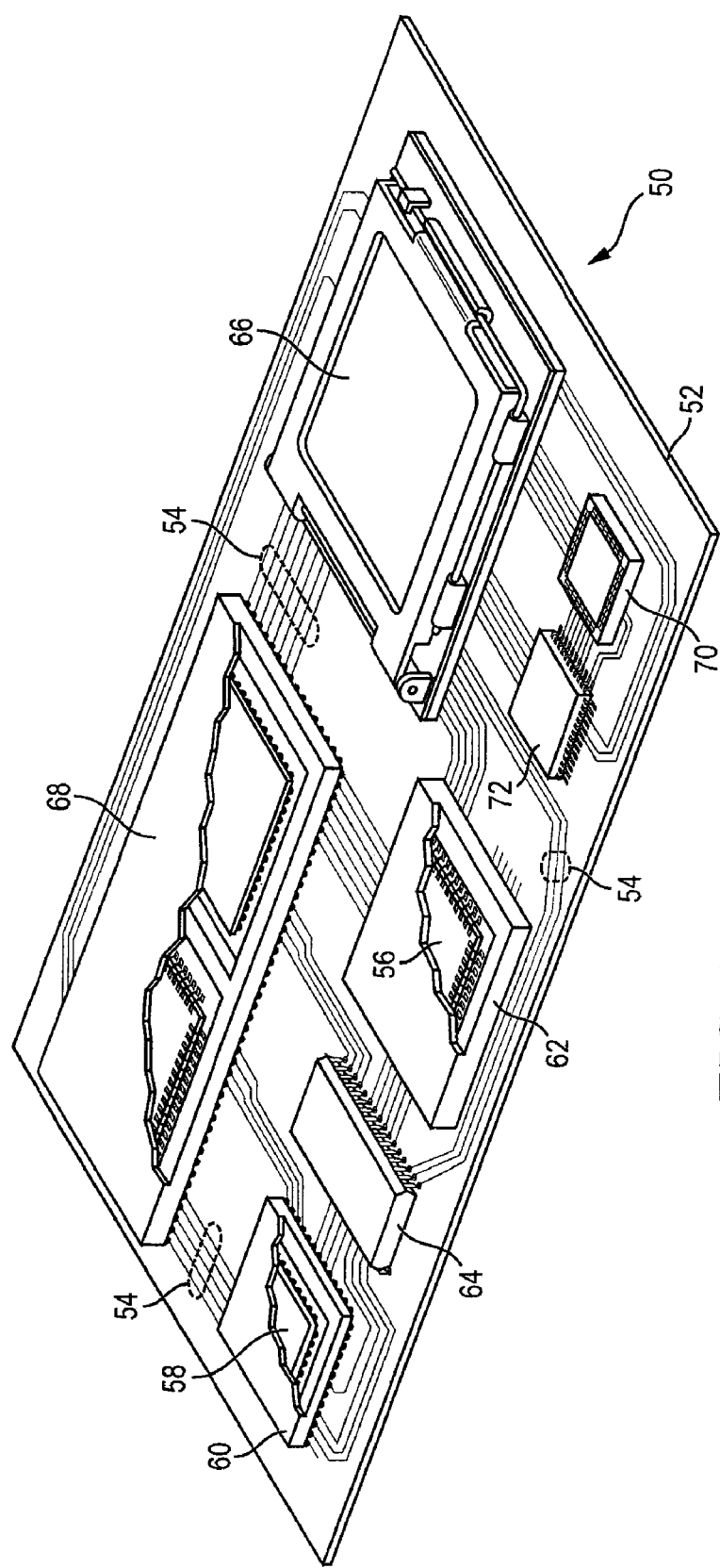
FIG. 1 illustrates a PCB with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 may have one type of semiconductor package, or multiple types of semiconductor packages, depending on the application. The different types of semiconductor packages are shown in FIG. 1 for purposes of illustration.

Electronic device 50 may be a stand-alone system that uses the semiconductor packages to perform one or more electrical functions. Alternatively, electronic device 50 may be a subcomponent of a larger system. For example, electronic device 50 may be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including wire bond package 56 and flip chip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 2A:
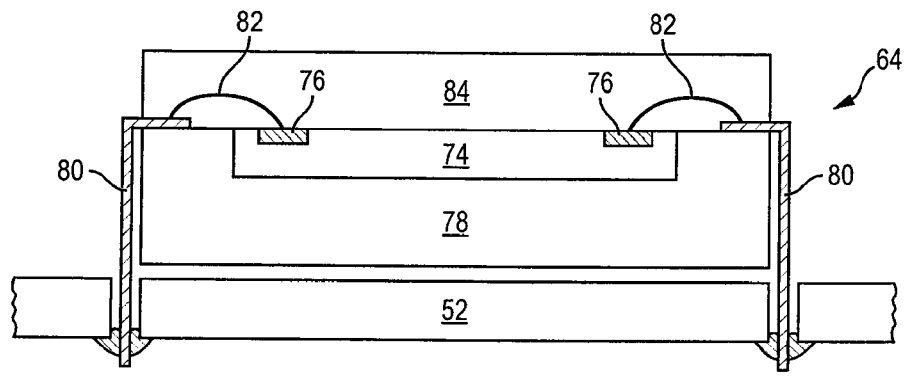
FIGS. 2a-2c illustrate further detail of the representative semiconductor packages mounted to the PCB.
Figure 2B:
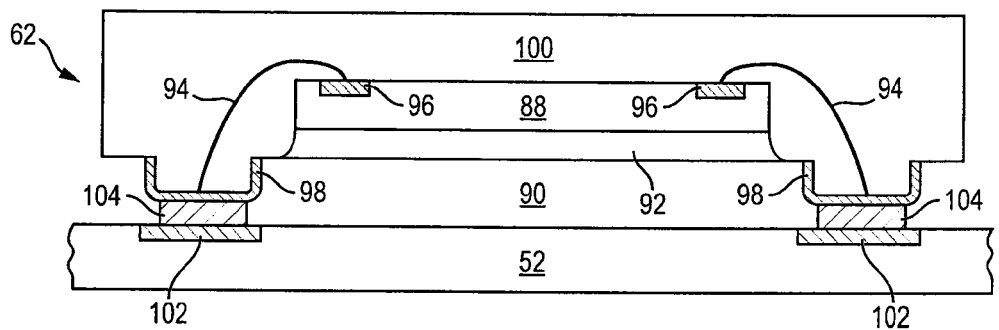
Figure 2C:
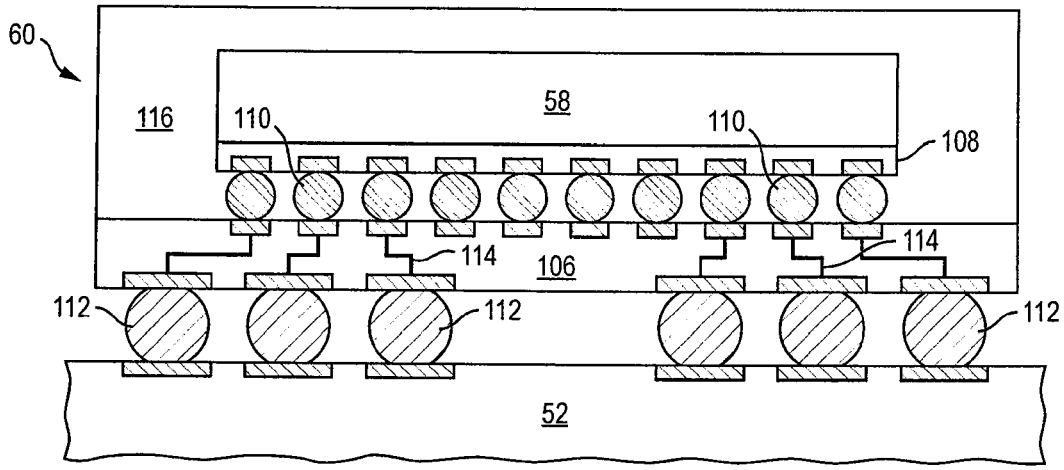

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit may include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and wire bonds 82 provide electrical interconnect between semiconductor die 74 and PCB 52. Encapsulant 84 is deposited over the package for environmental protection by preventing moisture and particles from entering the package and contaminating die 74 or wire bonds 82.

FIG. 2b illustrates further detail of BCC 62 mounted on PCB 52. Semiconductor die 88 is mounted over carrier 90 using an underfill or epoxy-resin adhesive material 92. Wire bonds 94 provide first level packing interconnect between contact pads 96 and 98. Molding compound or encapsulant 100 is deposited over semiconductor die 88 and wire bonds 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flip chip style first level packaging. Active region 108 of semiconductor die 58 contains analog or digital circuits implemented as active devices, passive devices, conductive layers, and dielectric layers formed according to the electrical design of the die. For example, the circuit may include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flip chip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flip chip style first level packaging without intermediate carrier 106.

Figure 3A:

FIGS. 3a-3j illustrate, in relation to FIGS. 1 and 2a-2c, a process of forming wafer level PiP mounted to a substrate with inner known good die interconnected with conductive bumps formed in shallow vias. In FIG. 3a, a substrate or carrier 120 contains temporary or sacrificial base material such as silicon, polymer, polymer composite, metal, ceramic, glass, glass epoxy, beryllium oxide, or other suitable low-cost, rigid material or bulk semiconductor material for structural support. A plurality of shallow vias 121 is formed in the surface of carrier 120.

Figure 3B:
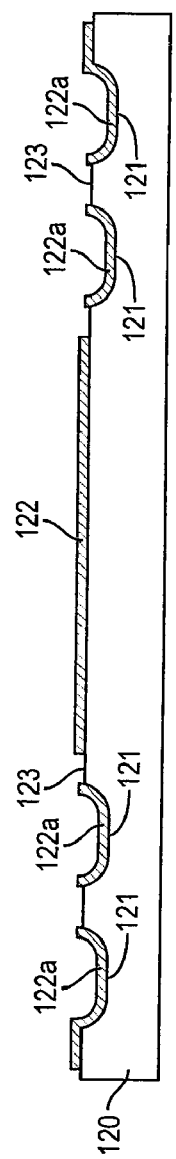

In FIG. 3b, an electrically conductive layer 122 is formed over surface 123 of carrier 120, including following the contour of vias 121, using a patterning and metal deposition process such as PVD, CVD, sputtering, electrolytic plating, and electroless plating. A portion of conductive layer 122, denoted as conductive bumps 122a, resides in vias 121. Conductive layer 122 can be one or more layers of Al, Cu, Sn, Ni, Au, Ag, or other suitable electrically conductive material. Portions of conductive layer 122 can be electrically common or electrically isolated depending on the design and function of the semiconductor device.

Figure 3C:
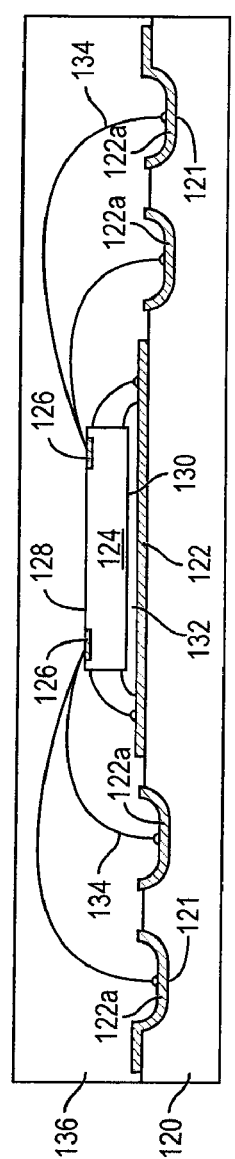

In FIG. 3c, semiconductor die or component 124 is mounted to conductive layer 122 with contact pads 126 on active surface 128 oriented upward away from carrier 120. Active surface 128 contains analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 128 to implement analog circuits or digital circuits, such as digital signal processor (DSP), ASIC, memory, or other signal processing circuit. Semiconductor die 124 may also contain IPDs, such as inductors, capacitors, and resistors, for RF signal processing. Back surface 130 is secured to conductive layer 122 with an adhesive material 132, such as thermal epoxy or epoxy resin. Bond wires 134 are formed between contact pads 126 to conductive layer 122 for electrical interconnect.

An encapsulant or molding compound 136 is deposited over semiconductor die 124, conductive layer 122, and bond wires 134 using a paste printing, compressive molding, transfer molding, liquid encapsulant molding, vacuum lamination, spin coating, or other suitable applicator. Encapsulant 136 can be polymer composite material, such as epoxy resin with filler, epoxy acrylate with filler, or polymer with proper filler. Encapsulant 136 is non-conductive and environmentally protects the semiconductor device from external elements and contaminants.

Figure 3D:
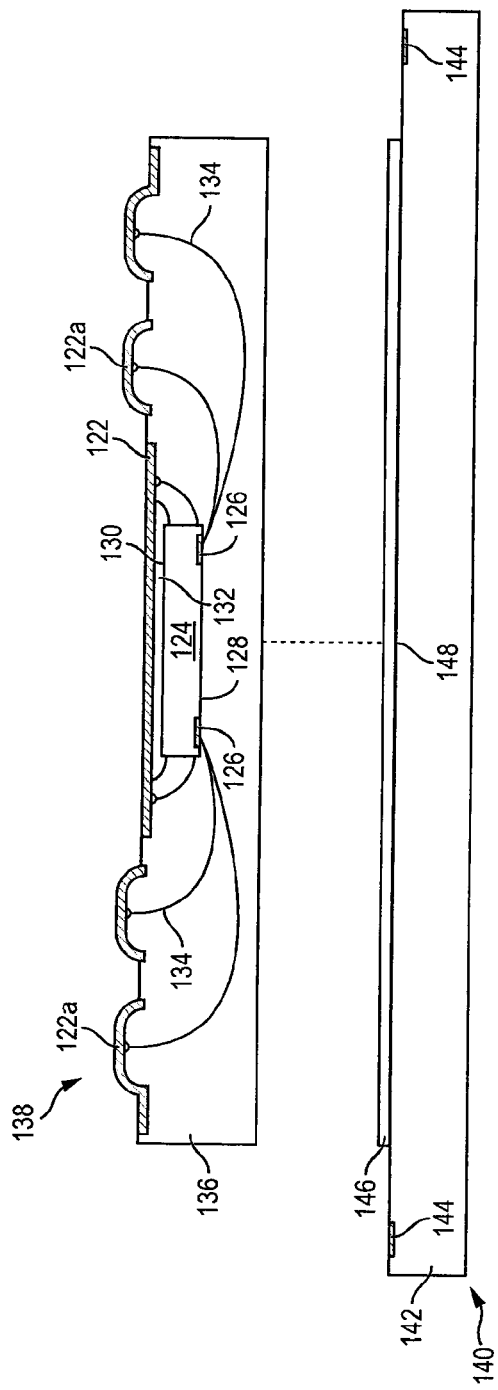

FIG. 3d shows a semiconductor wafer 140 containing a base substrate material 142 such as silicon, germanium, gallium arsenide, indium phosphide, or silicon carbide, for structural support. An electrically conductive layer 144 is formed over substrate 142 using a patterning and metal deposition process such as PVD, CVD, sputtering, electrolytic plating, and electroless plating. Conductive layer 144 can be one or more layers of Al, Cu, Sn, Ni, Au, Ag, or other suitable electrically conductive material. Conductive layer 144 provides electrical interconnect. Portions of conductive layer 144 can be electrically common or electrically isolated depending on the design and function of the semiconductor device. An adhesive layer 146, such as thermal epoxy or epoxy resin, is formed over a surface of substrate 142.

In another embodiment, semiconductor wafer 140 may also contain a plurality of semiconductor die each having an active region 148 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 148 to implement baseband analog circuits or digital circuits, such as DSP, memory, or other signal processing circuit. Semiconductor wafer 140 may also contain IPDs, such as inductors, capacitors, and resistors, for RF signal processing. Conductive layer 144 is electrically connected to the active and passive circuits in active region 148.

Figure 3E:
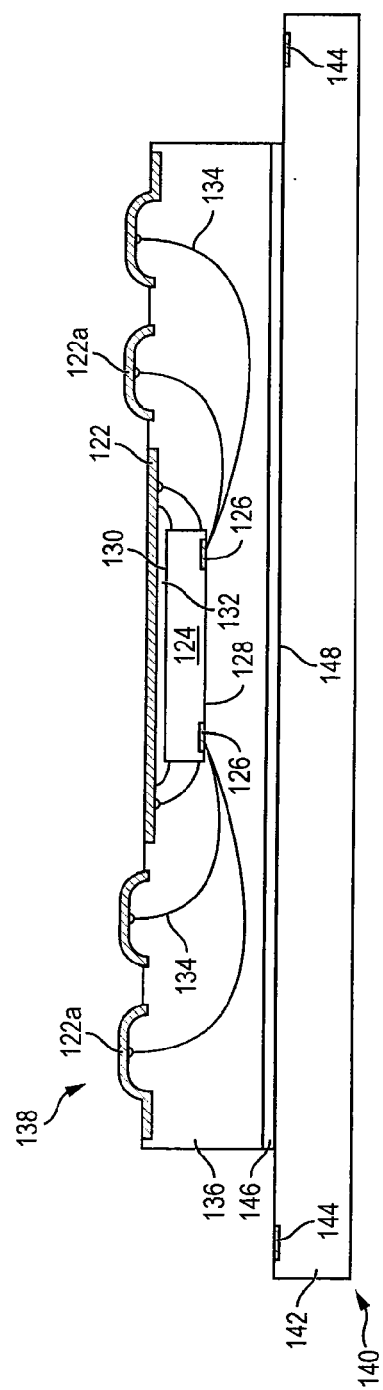

The temporary carrier 120 is removed by chemical etching, mechanical peel-off, CMP, mechanical grinding, thermal bake, laser scanning, or wet stripping to expose conductive bumps 122a. The semiconductor package 138 is inverted and mounted to substrate 142 with encapsulant 136 contacting adhesive layer 146, as shown in FIGS. 3d-3e.

In FIG. 3f, bond wires 150 are formed between conductive layer 122 and conductive layer 144. The active and passive circuits of semiconductor die 124 are electrically connected through contact pads 126, bond wires 134, conductive layer 122, and bond wires 150 to conductive layer 144 of substrate 142.

An adhesive layer 152, such as thermal epoxy or epoxy resin, is formed over a portion of conductive layer 122 opposite semiconductor die 124. A semiconductor die or component 154 is mounted with back surface 156 to conductive layer 122 and contact pads 158 on active surface 160 oriented upward away from conductive layer 122. Active surface 160 contains analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 160 to implement analog circuits or digital circuits, such as DSP, ASIC, memory, or other signal processing circuit. Semiconductor die 154 may also contain IPDs, such as inductors, capacitors, and resistors, for RF signal processing.

In FIG. 3g, an encapsulant or molding compound 162 is deposited over semiconductor package 138, bond wires 150, and substrate 142 using a paste printing, compressive molding, transfer molding, liquid encapsulant molding, vacuum lamination, spin coating, or other suitable applicator. Encapsulant 162 can be polymer composite material, such as epoxy resin with filler, epoxy acrylate with filler, or polymer with proper filler. Encapsulant 162 is non-conductive and environmentally protects the semiconductor device from external elements and contaminants.

In FIG. 3h, a plurality of shallow vias 167a and 167b is formed in the surface of encapsulant 162 by an etching process to expose conductive bumps 122a and contact pads 158.

In FIG. 3i, an electrically conductive layer 164 is formed over encapsulant 162, conductive bumps 122a, and contact pads 158 using a patterning and metal deposition process such as PVD, CVD, sputtering, electrolytic plating, and electroless plating. A portion of conductive layer 164, denoted as conductive bumps 164a and 164b, resides in vias 167a and 167b. Conductive layer 164 can be one or more layers of Al, Cu, Sn, Ni, Au, Ag, or other suitable electrically conductive material. Conductive layer 164 operates as a redistribution layer (RDL) and provides electrical interconnect between the active and passive circuits of semiconductor die 154 and conductive layer 122. Conductive bumps 164a are electrically connected to conductive bumps 122a, and conductive bumps 164b are electrically connected to contact pads 158. Other portions of conductive layer 164 can be electrically common or electrically isolated depending on the design and function of the semiconductor device.

Figure 3J:
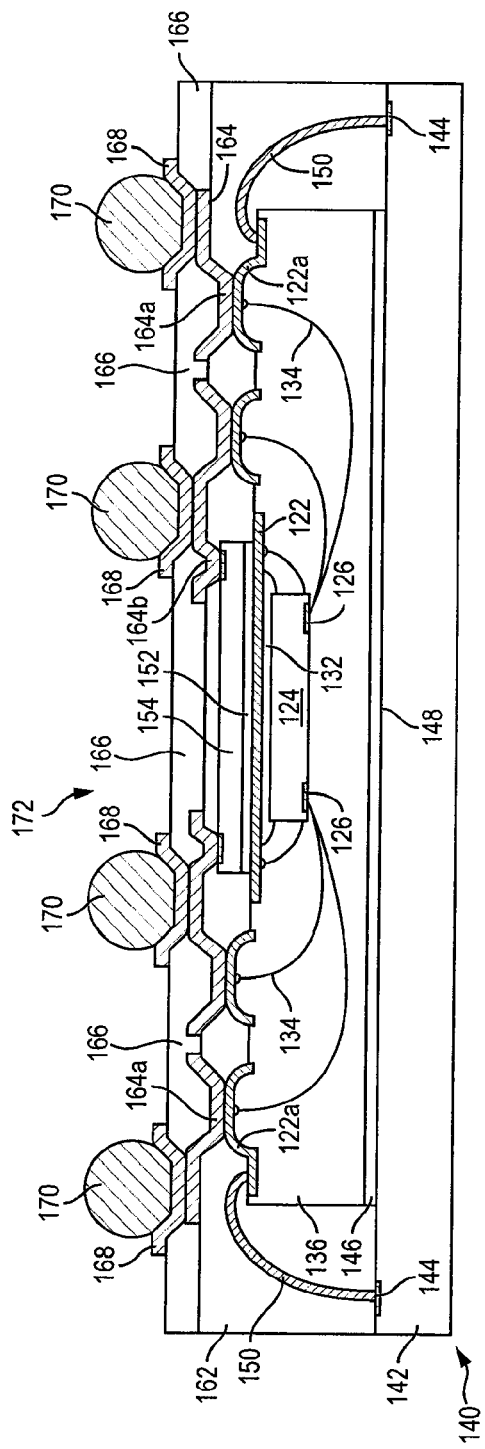

In FIG. 3j, an insulating or passivation layer 166 is formed over encapsulant 162 and conductive layer 164 using PVD, CVD, printing, spin coating, spray coating, sintering or thermal oxidation. The insulating layer 166 can be one or more layers of silicon dioxide ($SiO_2$), silicon nitride ($Si_3N_4$), silicon oxynitride (SiON), tantalum pentoxide ($Ta_2O_5$), aluminum oxide ($Al_2O_3$), or other material having similar insulating and structural properties. A portion of insulating layer 166 is removed by an etching process to expose conductive layer 164.

An electrically conductive layer 168 is formed over conductive layer 164 and insulating layer 166 using a patterning and deposition process such as PVD, CVD, sputtering, electrolytic plating, and electroless plating. Conductive layer 168 forms a multi-layer under bump metallization (UBM) including a barrier layer and adhesion layer. In one embodiment, the barrier layer contains Ni, titanium tungsten (TiW), chromium copper (CrCu), nickel vanadium (NiV), platinum (Pt), or palladium (Pd). The adhesion layer contains Al, titanium (Ti), chromium (Cr), or titanium nitride (TiN). UBM 168 provides a low resistive interconnect, as well as a barrier to Cu or solder diffusion.

An electrically conductive bump material is deposited over UBM 168 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to UBM 168 using a suitable attachment or bonding process. In one embodiment, the bump material is reflowed by heating the material above its melting point to form spherical balls or bumps 170. In some applications, bumps 170 are reflowed a second time to improve electrical contact to UBM 168. The bumps can also be compression bonded to UBM 168. Bumps 170 represent one type of interconnect structure that can be formed over UBM 168. The interconnect structure can also use stud bumps, micro bumps, conductive pillars, or other electrical interconnect.

Semiconductor die 124 is a known good die (KGD) having been tested and passed functionality, reliability, and interconnect specifications. Semiconductor die 124 is packaged within encapsulant 136 and serves as an inner KGD of wafer-level PiP 172. The active and passive circuits of KGD 124 are electrically connected through contact pads 126, bond wires 134, conductive layer 122, conductive layer 144, conductive bumps 122a and 164a, and contact pads 158 to the active and passive circuits of semiconductor die 154. The active and passive circuits of KGD 124 and semiconductor die 154 are also electrically connected through bond wires 150 to conductive layer 144 of substrate 142, and through conductive layer 168 and bumps 170 to external devices. The shallow via 121 and 167 with associated conductive bumps 122a and 164a have reduced the headroom needed for semiconductor die 154 and to electrically interconnect semiconductor die 124 and 154 in PiP 172.

Figure 4:
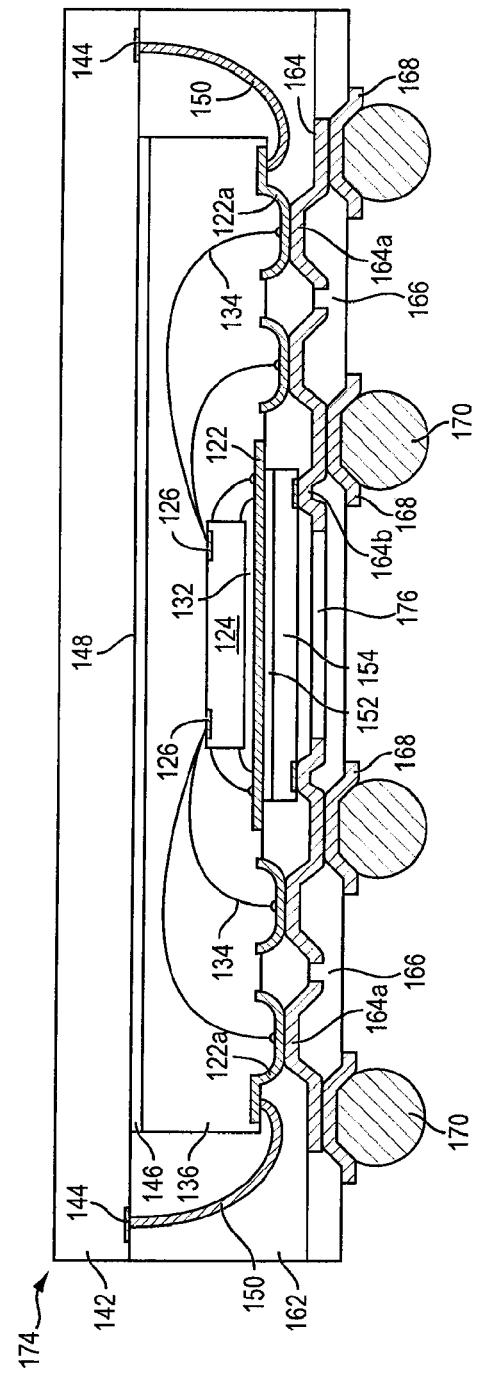
FIG. 4 illustrates the PiP with an IPD.

FIG. 4 shows an embodiment of wafer level PiP 174, similar to the structure described in FIGS. 3a-3j, with IPD 176 formed over encapsulant 162 adjacent to semiconductor die 154. IPD 176 constitutes one or more inductors, capacitors, and resistors for RF signal processing. IPD 176 is electrically connected to conductive layer 164.

Figure 5:
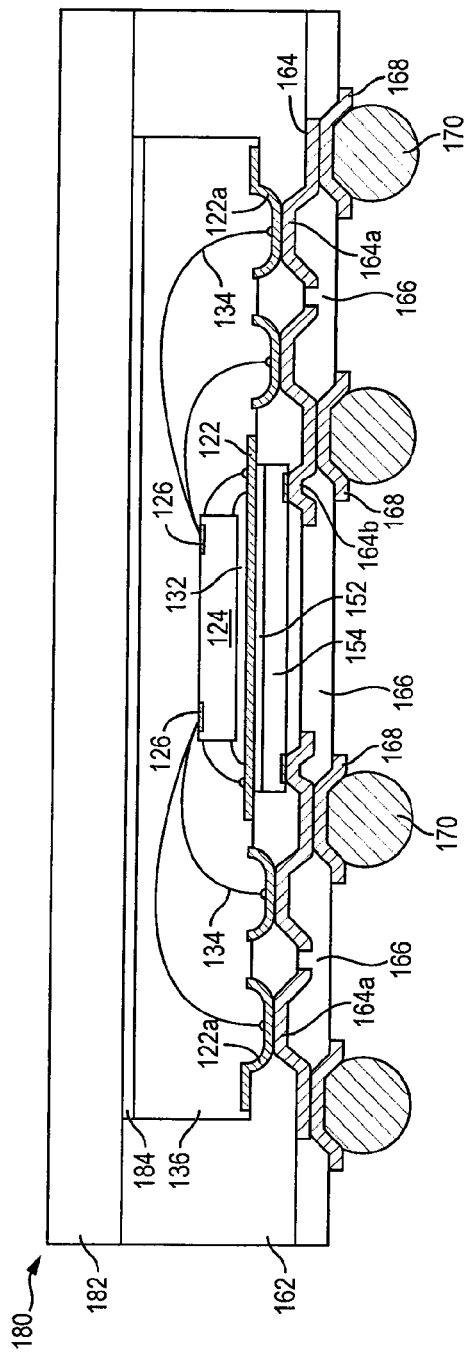
FIG. 5 illustrates the inner package mounted to a support layer.

FIG. 5 shows an embodiment of PiP 180, similar to the structure described in FIGS. 3a-3j, with semiconductor package 138 mounted to support layer 182 (instead of substrate 142) by adhesive layer 184. Support layer 182 can be a carrier, stiffener, or heat sink. In the case of a heat sink, support layer 182 can be Al, Cu, or another material with high thermal conductivity to provide heat dissipation for semiconductor die 122. An optional thermal interface material, such as aluminum oxide, zinc oxide, boron nitride, or pulverized silver, between heat sink 182 and semiconductor package 138 aids in the distribution and dissipation of heat generated by semiconductor die 124 and 154.

Figure 6:
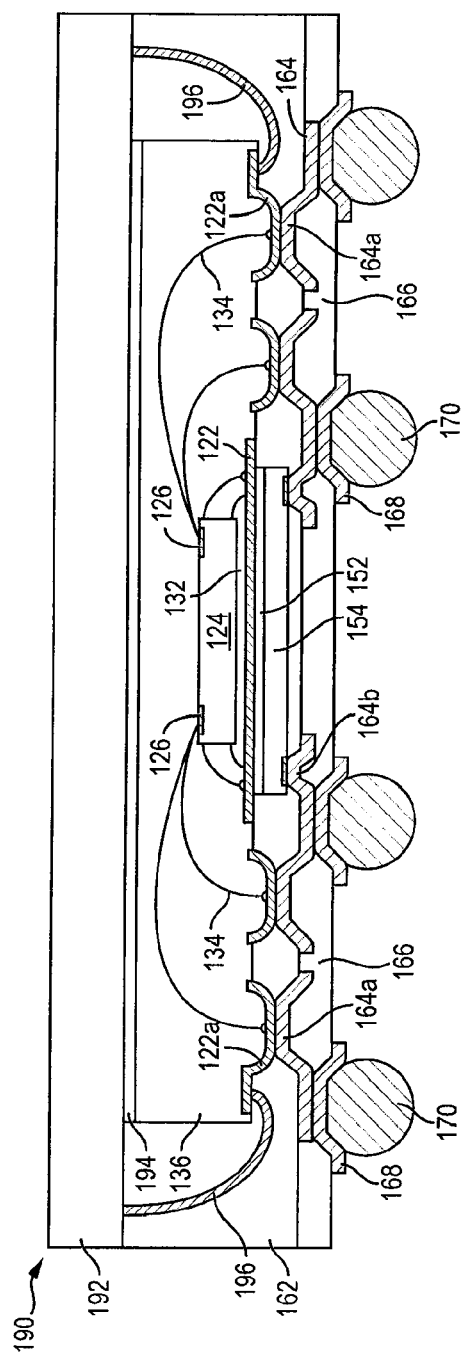
FIG. 6 illustrates the inner package mounted to an EMI and RFI shielding layer.

FIG. 6 shows an embodiment of PiP 190, similar to the structure described in FIGS. 3a-3j, with semiconductor package 138 mounted to electromagnetic interference (EMI) and radio frequency interference (RFI) shielding layer 192 (instead of substrate 142) by adhesive layer 194. Shielding layer 192 can be Cu, Al, ferrite or carbonyl iron, stainless steel, nickel silver, low-carbon steel, silicon-iron steel, foil, epoxy, conductive resin, and other metals and composites capable of blocking or absorbing EMI, RFI, and other inter-device interference. Shielding layer 192 can also be a non-metal material such as carbon-black or aluminum flake to reduce the effects of EMI and RFI. Shielding layer 192 is grounded through bond wires 196 to conductive layer 122 and 164 to bumps 170.

Figure 7A:
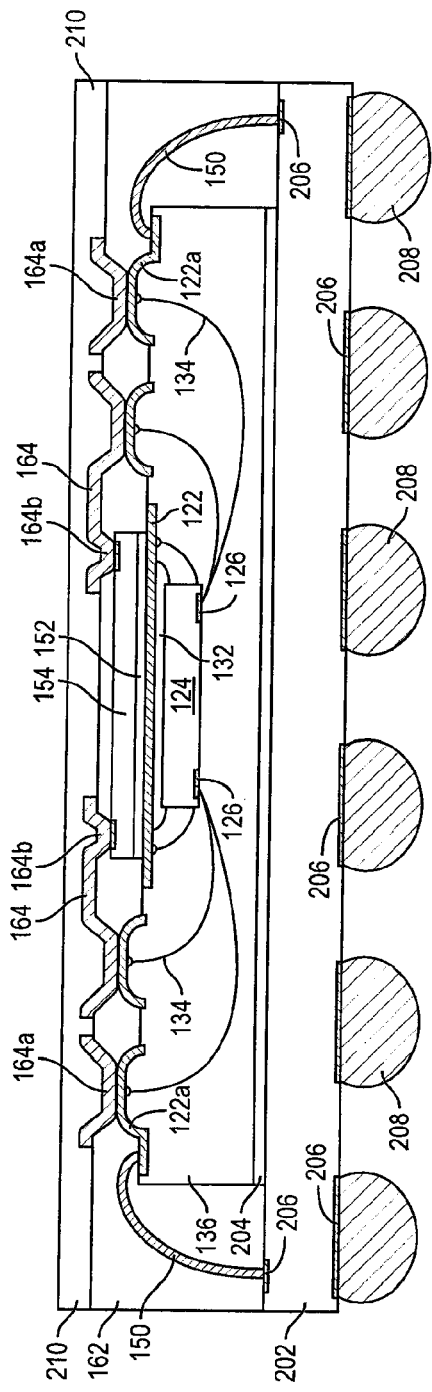
FIGS. 7a-7b illustrates the inner package mounted to a PCB.

FIG. 7a shows an embodiment of PiP 200, similar to the structure described in FIGS. 3a-3i, with semiconductor package 138 mounted to PCB 202 (instead of substrate 142) by adhesive layer 204. PCB 202 includes conductive layer 206 for electrical interconnect. Bond wires 150 are electrically connected to conductive layer 206. Bumps 208 are formed on conductive layer 206. An insulating or passivation layer 210 is formed over encapsulant 162 and conductive layer 164a using PVD, CVD, printing, spin coating, spray coating, sintering or thermal oxidation. The insulating layer 210 can be one or more layers of SiO2, Si3N4, SiON, Ta2O5, Al2O3, or other material having similar insulating and structural properties.

Figure 7B:
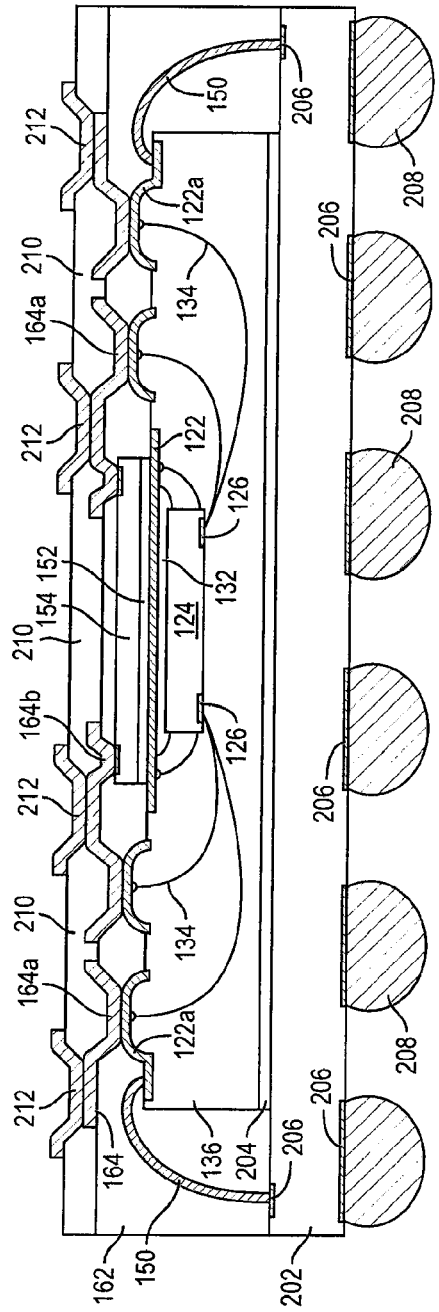
Figure 8C:
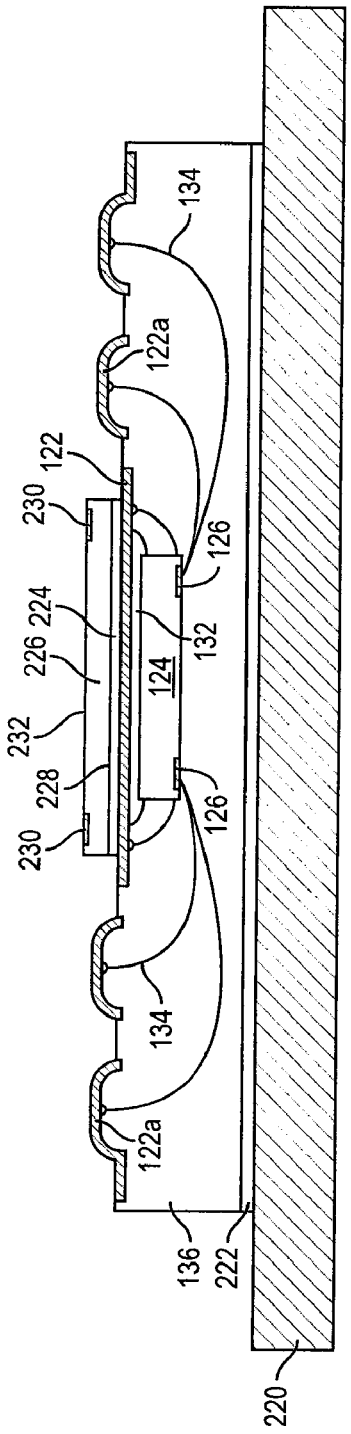

In FIG. 7b, a portion of insulating layer 210 is removed by an etching process to expose conductive layer 164. An electrically conductive layer 212 is formed over conductive layer 164 using a patterning and metal deposition process such as PVD, CVD, sputtering, electrolytic plating, and electroless plating. Conductive layer 212 forms a multi-layer UBM including a barrier layer and adhesion layer. In one embodiment, the barrier layer contains Ni, NiV, TiW, CrCu, Pt, or Pd. The adhesion layer contains Al, Ti, Cr, or TiN. UBM 168 provides a low resistive interconnect, as well as a barrier to Cu or solder diffusion FIGS. 8a-8h illustrate, in relation to FIGS. 1 and 2a-2c, a process of forming PiP mounted to a carrier with inner known good die interconnected with conductive bumps formed in shallow vias. In FIG. 8a, a substrate or carrier 220 contains temporary or sacrificial base material such as silicon, polymer, polymer composite, metal, ceramic, glass, glass epoxy, beryllium oxide, or other suitable low-cost, rigid material or bulk semiconductor material for structural support. In one embodiment, carrier 120 is Cu. An adhesive layer 222, such as thermal epoxy or epoxy resin, is formed over a surface of carrier 220. The semiconductor package 138 from FIG. 3d is mounted to carrier 220 with encapsulant 136 contacting adhesive layer 222, as shown in FIGS. 8a-8b.

In FIG. 8c, an adhesive layer 224, such as thermal epoxy or epoxy resin, is formed over a portion of conductive layer 122 opposite semiconductor die 124. A semiconductor die or component 226 is mounted with back surface 228 to conductive layer 122 and contact pads 230 on active surface 232 oriented upward away from conductive layer 122. Active surface 232 contains analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 232 to implement analog circuits or digital circuits, such as DSP, ASIC, memory, or other signal processing circuit. Semiconductor die 226 may also contain IPDs, such as inductors, capacitors, and resistors, for RF signal processing.

Figure 8D:
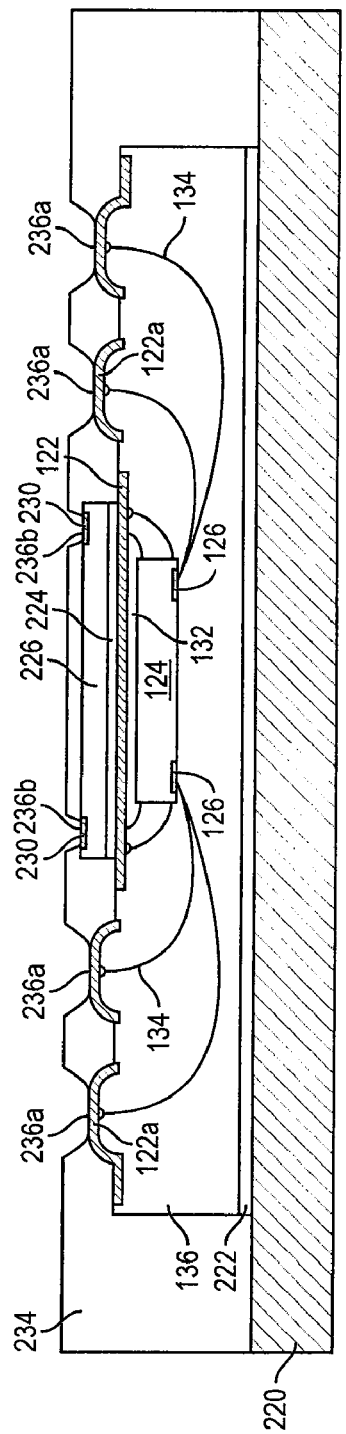

In FIG. 8d, an encapsulant or molding compound 234 is deposited over semiconductor package 138 and carrier 220 using a paste printing, compressive molding, transfer molding, liquid encapsulant molding, vacuum lamination, spin coating, or other suitable applicator. Encapsulant 234 can be polymer composite material, such as epoxy resin with filler, epoxy acrylate with filler, or polymer with proper filler. Encapsulant 234 is non-conductive and environmentally protects the semiconductor device from external elements and contaminants. A plurality of shallow vias 236a and 236b is formed in the surface of encapsulant 234 by an etching process to expose conductive bumps 122a and contact pads 230.

Figure 8E:
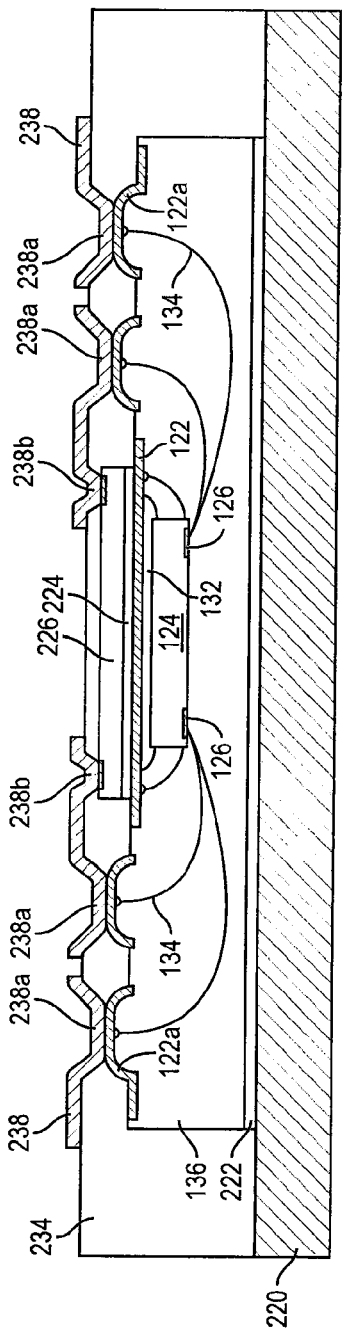

In FIG. 8e, an electrically conductive layer 238 is formed over encapsulant 234, conductive bumps 122a, and contact pads 230 using a patterning and metal deposition process such as PVD, CVD, sputtering, electrolytic plating, and electroless plating. A portion of conductive layer 238, denoted as conductive bumps 238a and 238b, resides in vias 236a and 236b. Conductive layer 238 can be one or more layers of Al, Cu, Sn, Ni, Au, Ag, or other suitable electrically conductive material. Conductive layer 238 operates as an RDL and provides electrical interconnect between the active and passive circuits of semiconductor die 226 and conductive layer 122. Conductive bumps 238a are electrically connected to conductive bumps 122a and contact pads 230. Other portions of conductive layer 238 can be electrically common or electrically isolated depending on the design and function of the semiconductor device.

Figure 8F:
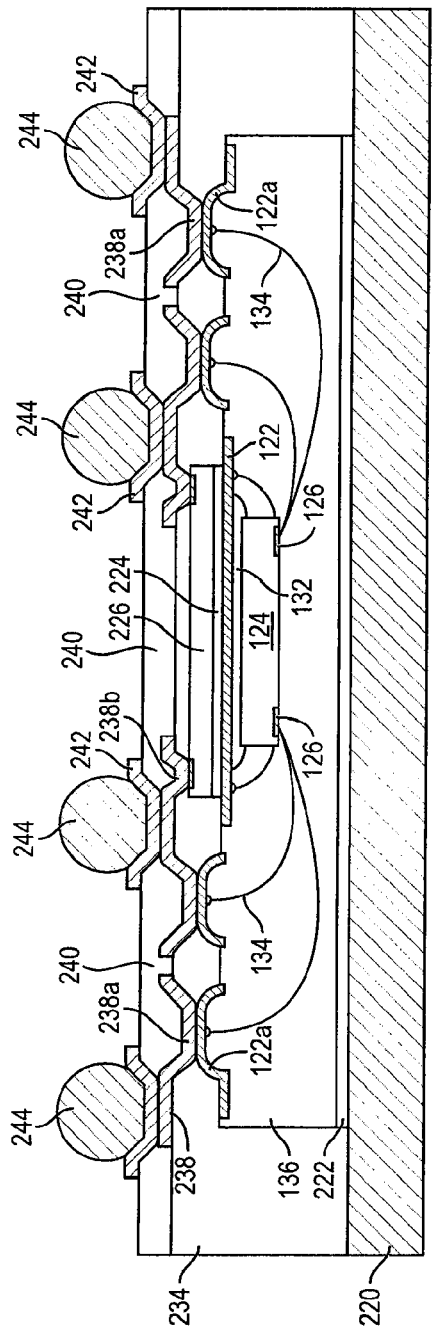

In FIG. 8f, an insulating or passivation layer 240 is formed over encapsulant 234 and conductive layer 238 using PVD, CVD, printing, spin coating, spray coating, sintering or thermal oxidation. The insulating layer 240 can be one or more layers of SiO2, Si3N4, SiON, Ta2O5, Al2O3, or other material having similar insulating and structural properties. A portion of insulating layer 240 is removed by an etching process to expose conductive layer 238.

An electrically conductive layer 242 is formed over conductive layer 238 using a patterning and deposition process such as PVD, CVD, sputtering, electrolytic plating, and electroless plating. Conductive layer 242 forms a multi-layer UBM including a barrier layer and adhesion layer. In one embodiment, the barrier layer contains Ni, NiV, TiW, CrCu, Pt, or Pd. The adhesion layer contains Al, Ti, Cr, or TiN. UBM 242 provides a low resistive interconnect, as well as a barrier to Cu or solder diffusion.

An electrically conductive bump material is deposited over UBM 242 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to UBM 242 using a suitable attachment or bonding process. In one embodiment, the bump material is reflowed by heating the material above its melting point to form spherical balls or bumps 244. In some applications, bumps 244 are reflowed a second time to improve electrical contact to UBM 242. The bumps can also be compression bonded to UBM 242. Bumps 244 represent one type of interconnect structure that can be formed over UBM 242. The interconnect structure can also use stud bumps, micro bumps, conductive pillars, or other electrical interconnect.

Figure 8G:
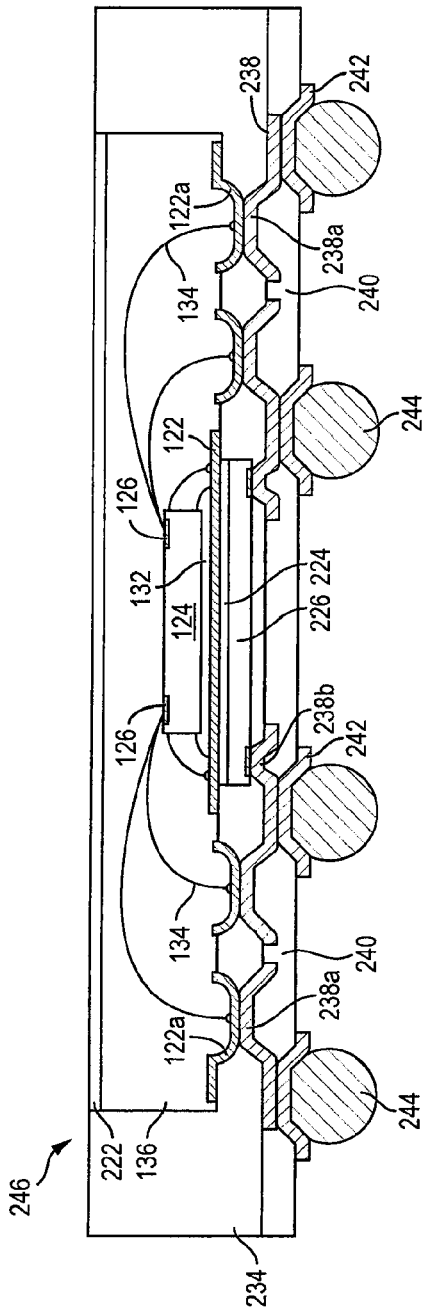
Figure 8H:
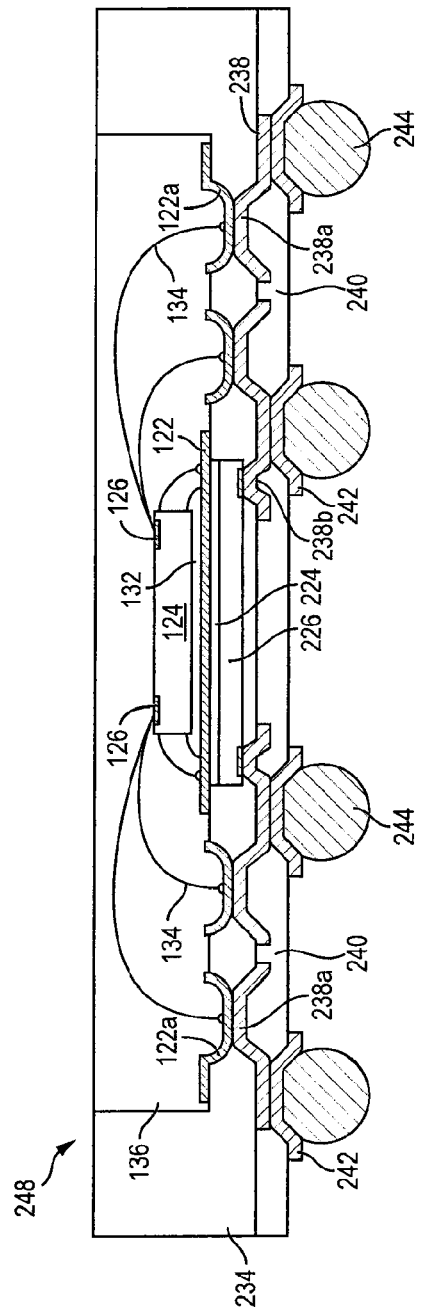

In FIG. 8g, temporary carrier 220 is removed by chemical etching, mechanical peel-off, CMP, mechanical grinding, thermal bake, laser scanning, or wet stripping. Adhesive layer 222 remains exposed in PiP 246. FIG. 8h shows PiP 248 with both carrier 220 and adhesive layer 222 removed.

Semiconductor die 124 is a known good die (KGD) having been tested and passed functionality, reliability, and interconnect specifications. Semiconductor die 124 is packaged within encapsulant 136 and serves as an inner KGD of PiP 246. The active and passive circuits of KGD 124 are electrically connected through contact pads 126, bond wires 134, conductive layer 122, conductive layer 144, conductive bumps 122a and 238a, and contact pads 230 to the active and passive circuits of semiconductor die 226. The active and passive circuits of KGD 124 and semiconductor die 226 are also electrically connected through conductive layer 242 and bumps 244 to external devices. The shallow vias 121, 167, and 236 with associated conductive bumps 122a, 164a, and 238a have reduced the headroom needed for semiconductor die 226 and to electrically interconnect semiconductor die 124 and 226 in PiP 246.

While one or more embodiments of the present invention have been illustrated in detail, the skilled artisan will appreciate that modifications and adaptations to those embodiments may be made without departing from the scope of the present invention as set forth in the following claims.

What is claimed:
1. A method of manufacturing a semiconductor device, comprising:
   providing a temporary carrier;
   forming a first via in the temporary carrier;
   forming a first conductive layer over the temporary carrier and into the first via, the first conductive layer in the first via forming a conductive bump;
   mounting a first semiconductor die to the first conductive layer;
   forming a bond wire between the first semiconductor die and first conductive layer;
   depositing a first encapsulant over the first semiconductor die, first conductive layer, temporary carrier, and bond wire;
   removing the temporary carrier to provide a semiconductor package with the conductive bump exposed;
   providing a substrate;
   mounting a surface of the semiconductor package opposite the conductive bump to the substrate;
   mounting a second semiconductor die to the first conductive layer opposite the first semiconductor die;
   depositing a second encapsulant over the second semiconductor die and semiconductor package;
   forming a second via in the second encapsulant to expose the conductive bump; and
   forming a second conductive layer over the second encapsulant and into the second via, the second conductive layer being electrically connected to the second semiconductor die.

2. The method of claim 1, further including:
   forming a third conductive layer over the substrate; and
   forming a bond wire between the first conductive layer and third conductive layer prior to depositing the second encapsulant.

3. The method of claim 1, further including:
   forming an insulating layer over the second conductive layer and second encapsulant;
   forming a third conductive layer over the second conductive layer; and
   forming a bump over the third conductive layer.

4. The method of claim 1, wherein the first semiconductor die is a known good die.

5. A method of manufacturing a semiconductor device, comprising:
   providing a carrier;
   forming a first via in the carrier;
   forming a first conductive layer over the carrier and into the first via, the first conductive layer in the first via forming a conductive bump;

mounting a first semiconductor die or component to the first conductive layer;

depositing a first encapsulant over the first semiconductor die or component, first conductive layer, and carrier;

removing the carrier to provide a semiconductor package including the conductive bump exposed;

providing a support layer;

mounting the semiconductor package to the support layer;

mounting a second semiconductor die or component to the first conductive layer opposite the first semiconductor die or component;

depositing a second encapsulant over the second semiconductor die or component and semiconductor package; and forming an interconnect structure over the second encapsulant, the interconnect structure being electrically connected to the conductive bump and second semiconductor die or component.

6. The method of claim 5, wherein forming the interconnect structure includes:

forming a second via in the second encapsulant to expose the conductive bump; and forming a second conductive layer over the second encapsulant and into the second via, the second conductive layer being electrically connected to the second semiconductor die or component.

7. The method of claim 6, wherein forming the interconnect structure further includes:

forming an insulating layer over the second conductive layer and second encapsulant;

forming a third conductive layer over the second conductive layer; and forming a bump over the third conductive layer.

8. The method of claim 5, wherein providing the support layer includes:

providing a substrate;

forming a second conductive layer over the substrate; and forming a bond wire between the first conductive layer and second conductive layer prior to depositing the second encapsulant.

9. The method of claim 5, wherein providing the support layer includes:

providing a carrier; and mounting the semiconductor package to the carrier.

10. A method of manufacturing a semiconductor device, comprising:

forming a semiconductor package including a first surface comprising a conductive bump and second surface opposite the first surface;

providing a support layer;

mounting the second surface of the semiconductor package to the support layer;

mounting a first semiconductor die or component to the first surface of the semiconductor package;

depositing a first encapsulant over the first semiconductor die or component and semiconductor package; and forming an interconnect structure over the first encapsulant, the interconnect structure being electrically connected to the conductive bump and first semiconductor die or component.

11. The method of claim 10, wherein forming the semiconductor package includes:

providing a carrier;

forming a first via in the carrier;

forming a conductive layer over the carrier and into the via, the conductive layer in the via forming the conductive bump;

mounting a second semiconductor die or component to the conductive layer;

depositing a second encapsulant over the second semiconductor die or component, conductive layer, and carrier; and removing the carrier.

12. The method of claim 11, wherein the second semiconductor die or component is a known good die or component.

13. The method of claim 10, wherein forming the interconnect structure includes:

forming a via in the first encapsulant to expose the conductive bump; and forming a first conductive layer over the first encapsulant and into the via, the first conductive layer being electrically connected to the first semiconductor die or component.

14. The method of claim 13, wherein forming the interconnect structure further includes:

forming an insulating layer over the first conductive layer;

forming a second conductive layer over the first conductive layer; and forming a bump over the second conductive layer.

15. The method of claim 10, wherein the support layer operates as a substrate, stiffener, heat sink, shielding layer, printed circuit board, or carrier.

16. The method of claim 10, further including forming a bond wire electrically connected to the support layer and conductive bump of the semiconductor package.

17. A method of manufacturing a semiconductor device, comprising:

providing a semiconductor package including:

a) a first encapsulant including a bump disposed on a first surface of the first encapsulant, and b) a first conductive layer disposed over the first surface of the first encapsulant and comprising a portion of the first conductive layer disposed over the bump of the first encapsulant to form a conductive bump;

providing a support layer;

mounting a second surface of the semiconductor package opposite the first conductive layer of the semiconductor package to the support layer;

mounting a first semiconductor die or component over the first conductive layer of the semiconductor package; and depositing a second encapsulant over the first semiconductor die or component and semiconductor package.

18. The method of claim 17, wherein providing the semiconductor package includes:

providing a carrier comprising a via;

forming the first conductive layer over the carrier;

forming the first encapsulant over the first conductive layer and the carrier; and removing the carrier.

19. The method of claim 18, wherein providing the semiconductor package further includes:

mounting a second semiconductor die or component over the first conductive layer and the carrier, the second semiconductor die electrically connected to the first conductive layer.

20. The method of claim 19, wherein the second semiconductor die or component is a known good die.

21. The method of claim 17, further including forming an electrical connection between the support layer and the first conductive layer of the semiconductor package.

22. The method of claim 17, further including forming a via in the second encapsulant to expose the conductive bump of the semiconductor package.

23. The method of claim 17, further including forming a second conductive layer over the second encapsulant and electrically connected to the first semiconductor die or component and the first conductive layer of the semiconductor package.

24. The method of claim 23, further including:
forming an insulating layer over the second conductive layer and second encapsulant;
forming a third conductive layer over the second conductive layer; and
forming a bump over the third conductive layer.

25. The method of claim 17, wherein the support layer includes a stiffener, heat sink, shielding layer, or printed circuit board.

* * * * *

UNITED STATES PATENT AND TRADEMARK OFFICE
CERTIFICATE OF CORRECTION

PATENT NO. : 8,283,209 B2  Page 1 of 1
APPLICATION NO. : 12/635631
DATED : October 9, 2012
INVENTOR(S) : Zigmund R. Camacho, Frederick R. Dahilig and Lionel Chien Hui Tay It is certified that error appears in the above-identified patent and that said Letters Patent is hereby corrected as shown below:

On the Title Page, insert:

--Related U.S. Application Data

Continuation-in-part of application No. 12/136,768, filed on Jun. 10, 2008, now Pat. No. 7,977,779.--

Signed and Sealed this
Ninth Day of September, 2014

Michelle K. Lee
*Deputy Director of the United States Patent and Trademark Office*

UNITED STATES PATENT AND TRADEMARK OFFICE
CERTIFICATE OF CORRECTION

PATENT NO. : 8,283,209 B2  
APPLICATION NO. : 12/635631  
DATED : October 9, 2012  
INVENTOR(S) : Zigmund R. Camacho et al.

Page 1 of 1

It is certified that error appears in the above-identified patent and that said Letters Patent is hereby corrected as shown below:

On the title page item (75), should read:

Inventors: Zigmund R. Camacho, Singapore (SG);  
                  Frederick R. Dahilig, Singapore (SG);  
                  Lionel Chien Hui Tay, Singapore (SG)--;--  
                  --Arnel Senosa Trasporto, Singapore (SG);  
                  Henry Descalzo Bathan, Singapore (SG).--

Signed and Sealed this  
Nineteenth Day of July, 2016

Michelle K. Lee  
*Director of the United States Patent and Trademark Office*